United States Patent
Minogue

(10) Patent No.: US 6,345,718 B1
(45) Date of Patent: Feb. 12, 2002

(54) METHOD AND APPARATUS FOR IMMOBILIZING SOLDER SPHERES

(75) Inventor: Gerard R. Minogue, Kinnelon, NJ (US)

(73) Assignee: Fry's Metals, Inc., Jersey, NJ (US)

( * ) Notice: Subject to any disclaimer, the term of this patent is extended or adjusted under 35 U.S.C. 154(b) by 0 days.

(21) Appl. No.: 09/501,174

(22) Filed: Feb. 9, 2000

(51) Int. Cl.⁷ .......................... B65D 81/02; B65D 85/58
(52) U.S. Cl. ...................... 206/540; 706/719; 706/722; 706/814; 215/231
(58) Field of Search ............................. 206/719–723, 206/725, 523, 540, 814; 215/231

(56) References Cited

U.S. PATENT DOCUMENTS

| | | | |
|---|---|---|---|
| 2,857,068 A | * 10/1958 | Kraepelin | 215/231 |
| 3,010,570 A | 11/1961 | Sundstrom | |
| 3,075,667 A | 1/1963 | Lind | |
| 3,863,795 A | * 2/1975 | Mills | 215/231 |
| 3,949,879 A | 4/1976 | Peterson et al. | 206/522 |
| 4,209,893 A | * 7/1980 | Dyce et al. | 206/486 |
| 4,215,786 A | 8/1980 | Vertes | 215/231 |
| 4,240,240 A | 12/1980 | Cohen | 53/410 |
| 4,320,831 A | 3/1982 | Szabo et al. | 206/45.34 |
| 4,347,929 A | 9/1982 | Poe et al. | 206/3 |
| 4,426,675 A | 1/1984 | Robinson et al. | 361/415 |
| 4,782,967 A | * 11/1988 | Thomas | 215/231 |
| 4,883,172 A | * 11/1989 | Young | 206/721 |
| 5,411,156 A | * 5/1995 | Reckamp | 215/231 |
| 5,709,301 A | 1/1998 | Couch et al. | 206/361 |
| 5,957,293 A | * 9/1999 | Pakeriasamy | 206/725 |

FOREIGN PATENT DOCUMENTS

| | | |
|---|---|---|
| FR | 1362570 | 9/1964 |
| FR | 2070789 | 9/1971 |
| JP | 2000335633 | 12/2000 |

* cited by examiner

*Primary Examiner*—Jim Foster
(74) *Attorney, Agent, or Firm*—Mintz, Levin, Cohn, Ferris, Glovsky and Popeo, P.C.

(57) ABSTRACT

A containing device and method to hold and immobilize solder spheres during storage and transport including a container portion having an open top terminal end and an opposing closed bottom terminal end with at least one side wall connecting each terminal end, a removably attachable lid to seal the container portion and a lid insert for insertion into the container portion to immobilize solder spheres contained therein. In one embodiment, the lid insert is comprised of compressible material, such as a polymeric foam, whereby insertion of the lid insert into the container portion causes compression of the lid insert substantially adjacent to the side wall of the container portion, a bottom planar surface of the lid and an uppermost surface layer of solder spheres to completely fill any open or dead space within the containing device. The lid insert forms a mechanical seal which immobilizes the solder spheres until the lid insert is removed from the containing device.

8 Claims, 4 Drawing Sheets

METHOD AND APPARATUS FOR IMMOBILIZING SOLDER SPHERES

FIELD OF THE INVENTION

The present invention relates to a device and method to hold and immobilize articles and workpieces susceptible to mechanical damage during storage and transport. In particular, the present invention is a containing device and method for storage and transport of solder spheres used in the electronics industries for assembly of printed circuit boards and other electronic assemblies.

BACKGROUND OF THE INVENTION

Ball grid array (BGA) packages have become the means of choice to house and mount electronic components to larger printed circuit boards and other electronic assemblies. BGA packages typically include a plastic, ceramic or laminated substrate having a specific pattern of pads or recesses on an exposed surface which serve as contact points for mechanically and electrically connecting electronic components, such as integrated circuit chips, to circuit paths of printed circuit boards. BGA packages are mounted to printed circuit boards by surface mount technologies (SMT), including, for example, a process known as reflow soldering. Reflow soldering involves loading solder alloy spheres onto pads or recesses of BGAs and then coupling solder spheres to solder paste applied to specific areas on printed circuit boards which correspond to the array of pads or recesses of BGAs. High temperatures during reflow soldering melt spheres and cause solder to flow around contact points forming mechanical and electrical solder joints between BGAs and printed circuit boards. Accurate placement of solder alloy spheres onto arrays of pads or recesses is, therefore, a critical step in achieving satisfactory mechanical connections and electrical interconnections between integrated circuits housed within BGAs and printed circuit boards.

Automated handling systems, often referred to as pick-and-place systems, are used to load solder alloy spheres to particular soldering sites (pads or recesses) on BGAs. To confirm placement of solder alloy spheres, which can be as small as 0.030 inch in diameter, an automated vision system is often employed to determine if spheres are present at appropriate soldering sites prior to the inception of reflow soldering. An automated vision system rapidly scans an area of loaded solder pads with a high resolution camera. The high resolution camera digitizes the visual data collected to produce a gray level histogram which distinguishes the presence or absence of individual solder spheres by contrasting the bright and shiny surfaces of solder spheres with a darker and more matte background. Such a contrast between the shine of the solder sphere surfaces and the dark background establishes a pass-fail criterion that is used to determine whether a solder sphere is present at a particular site or not. A solder sphere which does not possess sufficient brightness and shine may cause the automated vision system to determine a false fail, indicating that a solder sphere is not present at a particular site, although a solder sphere has, in fact, been accurately placed at the site. The automated vision system may then indicate to an assembling system that a solder sphere is missing, whereby the assembling system may automatically reject the circuit board in question or discontinue production. For such reasons, assemblers and manufacturers of electronic components and systems prefer solder alloy spheres with bright, shiny surfaces in order to avoid erroneous rejection of electronic components and unnecessary production downtime.

It is well known that solder alloy spheres are subject to surface oxidation after manufacture due to an inherent propensity of base metals used in surface alloys, such as tin and lead, to oxidize, causing surfaces of solder spheres to darken. Of particular concern to suppliers of solder spheres is surface darkening produced during storage and transport of solder spheres due to mechanical surface damage or surface fret corrosion which exacerbates oxidation. Surface fret corrosion primarily occurs when surfaces of solder spheres rub against each other causing portions of sphere surfaces to be removed or chipped away. Conventional glass or plastic containers are typically filled with solder spheres by mass, rather than volume, which tends to produce an open or dead space between a bottom planar surface of a container lid and solder spheres contained therein. The dead space enables solder spheres to tumble about the container and to rub against each other, as well as against the side walls of the container, when the container is agitated during storage and transport. Surface fret corrosion is caused by a phenomenon called "slip-stick", whereby mechanical and frictional energy is produced between rubbing sphere surfaces, causing surfaces to bind up rather than slip past each other. Agitation during transport of the container causes bound surfaces to suddenly release, chipping away portions of surface alloy. An accumulated loss of surface alloy by surface fret corrosion causes solder spheres to oxidize and darken.

Prior art packaging and containers which include provisions to prevent mechanical damage to articles contained therein, do not include packaging or containers which immobilize solder alloy spheres. Prior art containers are often designed for specific articles and workpieces. U.S. Pat. No. 5,709,301 discloses a storage container having a foam insert disposed in a container lid to hold and store paint brushes and paint rollers. U.S. Pat. No. 4,347,929 discloses a container for storing and transporting explosives having a foam insert attached to a lid with cut-outs to accommodate blasting caps. In more analogous art, U.S. Pat. No. 4,426,675 discloses a carrier box for storing and transporting printed circuit boards which includes strips of electrically-conductive foam material on the bottom and sides of the container to reduce vibration of printed circuit boards during transport.

Therefore, a container specifically provided for the storage and transport of small solder alloy spheres that includes provisions to prevent movement of spheres, thereby preventing oxidation and preserving the brightness and shine of solder sphere surfaces is desirable.

SUMMARY OF THE INVENTION

The present invention relates to a containing device and method to store and transport solder spheres. More particularly, embodiments of the present invention include a containing device to hold and immobilize solder spheres contained therein to prevent mechanical and frictional damage to the surfaces of solder spheres caused by agitation of the containing device during storage and transport.

Embodiments of the present invention include a containing device comprising a hollow container portion having, for example, a circular cylindrical shape with an open top terminal end and an opposing closed bottom terminal end, and a side wall connecting each terminal end thereof. Although a first embodiment of the invention comprises the hollow container portion as a circular cylinder, the geometry of the container portion is not relevant to the invention and, therefore, not limited to any particular shape.

The container portion further comprises a lid which is removably attachable to the open top terminal end to seal the containing device, and a lid insert which is removably insertable into the container portion. The lid insert is of a dimension such that when inserted into the container portion the insert essentially fills an open or dead space between the lid and solder spheres which results once the container device has been filled by mass with solder spheres.

The function of the lid insert is a mechanical one. The lid insert is inserted into the container member by pressure produced from attachment of the lid to the container member. Attachment of the lid compresses the lid insert into the container portion and substantially adjacent to an inner surface of the side wall of the container portion, a bottom planar surface of the lid and an uppermost surface layer of solder spheres. Such firm contact forms an immobilizing seal that prevents movement of solder spheres when the containing device is agitated during storage and transport. The seal also prevents solder spheres from slipping between the lid insert and the side wall of the container portion.

The lid insert may be constructed of suitable compressible materials, such as polymeric foams. Polymeric foams impart a compressible capacity to the lid insert, wherein the lid insert may compress from about 20% to about 50% of its initial volume when inserted into the container portion.

The lid insert may be positioned for insertion into the container portion either manually or with automated handling equipment or similar means. In either case, the attachment of the lid to the container portion, which may be similarly achieved either manually or automatically with handling equipment or similar means, compresses the lid insert into the container portion. The lid insert forms the immobilizing seal as it completely fills the dead space above solder spheres and compresses substantially adjacent to the bottom planar surface of the container lid, the inner surface of the side wall and the uppermost surface layer of solder spheres.

In another embodiment of the invention, the lid insert includes a pull-type tab adhered to a top surface of the lid insert in order to facilitate removal of the lid insert from the container portion when removal of the solder spheres from the containing device is desired.

In another embodiment of the invention, the lid insert includes a semi-rigid or rigid layer of material or a pressure plate disposed on the top surface of the lid insert that is constructed of a thin layer or sheet of flexible, electrostatically dissipative, non-reactive plastic or polymer. The pressure plate imparts rigidity to the lid insert without compromising the compressibility of the lid insert. The pressure plate also provides an optimal surface on which the pull-type tab may be adhered for removal of the lid insert from the container portion.

In still another embodiment of the invention, the pressure plate further comprises a rim disposed along a circumferential perimeter of the pressure plate. The circumferential rim may be constructed of a compressible, non-reactive material including, but not limited to, closed cell polymeric foams and other suitable plastic or synthetic rubber foams, which may or may not be treated for electrostatic dissipative properties.

The circumferential rim compresses and wipes the inner surface of the container portion side wall when the lid insert is compressed into the container portion. The circumferential rim facilitates the formation of the immobilizing seal and prevents solder alloy spheres from penetrating the seal and becoming lodged between the inner surface of the side wall and the lid insert.

In yet another embodiment of the invention, the lid insert is adhered to the bottom planar surface of the lid such that when the lid is attached or detached from the container portion, the foam insert is inserted or removed from the container portion.

BRIEF DESCRIPTION OF THE DRAWINGS

For a better understanding of the present invention, reference is made to the drawings which are incorporated herein by reference and in which.

DETAILED DESCRIPTION OF THE INVENTION

Illustrative embodiments of the present invention described below are directed to a containing device to store and transport solder alloy spheres used in the manufacture of electronic components and assemblies. Those skilled in the art will appreciate, however, that embodiments in accordance with the present invention are not limited to storing and transporting solder alloy spheres, but rather, may be used in other applications which require immobilization of articles or workpieces that are sensitive to mechanical and frictional damage.

Embodiments of the present invention will be described below with reference to FIGS. 1–8 which are presented for the purpose of illustrating embodiments and are not intended to limit the scope of the claims.

Figure 1:
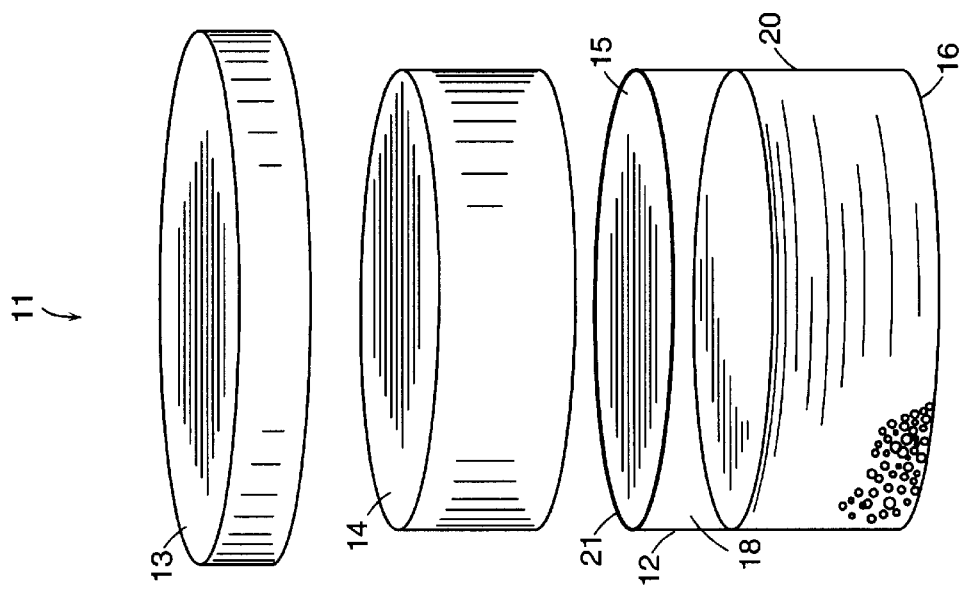
FIG. 1 illustrates a side view of a containing device according to the present invention.

FIGS. 1–8 illustrate a containing device 11 in accordance with the present invention to hold and immobilize solder alloy spheres. As shown in FIG. 1, a first embodiment of the invention includes the containing device 11 comprising a container portion 12 having an open top terminal end 15 and an opposing closed bottom terminal end 16 with at least one side wall 20 connecting each terminal end. The container portion 12 may comprise any geometry, as the shape of the container portion is not relevant to the invention. FIG. 1 illustrates a side view of the container portion 12 having a circular cylindrical shape.

Figure 3:
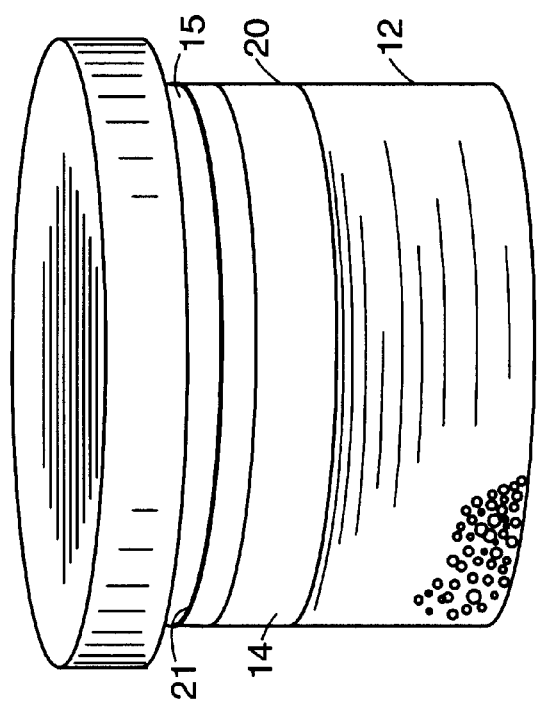
FIG. 3 illustrates a side view of a screw-top type lid for attachment to the container portion.

The containing device 11 further comprises a lid 13 which is removably attachable to the open top terminal end 15 to seal the container portion. The lid 13 may be a snap-top type, wherein the lid is sized to fit tightly over a perimeter lip 21 of the open top terminal end 15. The lid 13 may also be a screw-type, as shown in FIG. 3, wherein the lid comprises a set of threads disposed along an inner side portion of the lid which engages a corresponding set of threads disposed along the side wall 20 of the containing member 12 adjacent the perimeter lip of the open top terminal end 15. Although FIG. 3 illustrates a screw-type lid, the lid 13 of the present invention is not limited to a particular design and may be of any construction capable of sealing the container portion 12.

The container portion 12 and the lid 13 are constructed of non-reactive, resilient materials suitable for containing small solder alloy spheres including, but not limited to, glass, plastic or metal. The container portion 12 of the first embodiment is 3.25" in diameter and 2" in height. However, the container portion 12 is not limited to a particular overall dimension and may comprise any dimensions suitable for storing and transporting solder spheres.

Figure 2:
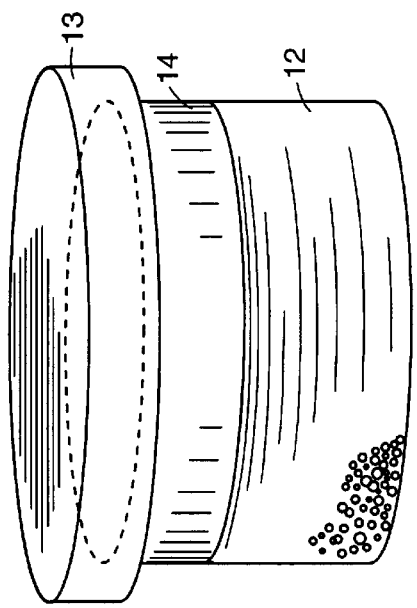
FIG. 2 illustrates a side view of a lid insert compressed within a container portion.

As shown in FIGS. 1 and 2, the containing device 11 further comprises a lid insert 14 for insertion into the container portion 12 to immobilize solder spheres contained therein. The lid insert 14 serves a mechanical function, whereby when inserted into the container portion solder spheres are immobilized and the potential for mechanical and frictional damage to sphere surfaces is eliminated. The lid insert 14 is sized to completely fill an open or dead space 18 created in the container portion 12 when the containing device 11 is filled with solder spheres. The containing device 11 is typically filled by mass rather than volume, hence the creation of the dead space 18 between the lid 13 and an uppermost layer of solder spheres. Such dead space 18 permits solder spheres to tumble and rub against each other when the containing device 11 is vibrated or agitated during transport which damages sphere surfaces. By completely filling the dead space 18, the lid insert 14 prevents such movement and preserves the desirable brightness and shine of the surfaces of solder alloy spheres.

The lid insert 14 may be positioned and inserted into the container portion 12 manually or by automated handling equipment or similar means. The lid 13 may be similarly attached to the container portion manually or by automated handling equipment or similar means. In the first embodiment of the invention shown in FIG. 2, attachment of the lid 13 to the container portion 12 produces pressure which compresses the lid insert 14 into the container portion 12, whereby the lid insert 14 fills the dead space 18 and is compressed substantially adjacent to an inner surface of the side wall 20 of the container portion, as well as substantially adjacent to a bottom planar surface of the lid 13 and an uppermost layer of solder spheres contained therein. The firm contact established by the lid insert 14 forms a seal which immobilizes solder spheres and prevents movement of spheres about the containing device 11 when the containing device is vibrated or agitated. The seal also prevents solder spheres from becoming lodged between the side wall 20 of the container portion and the lid insert 14.

The lid insert 14 shown in FIGS. 1–3 measures 3.125" in diameter and between 0.125 and 0.25" in thickness. The lid insert 14 is not limited to any particular overall dimension, but would change relative to any alteration in the overall dimension of the container portion 12. The dimension of the lid insert 14 is, however, such that the insert undergoes a vertical compression from about 20% to about 50% of its initial volume, with a minimum size reduction from about 20% to about 25%, when inserted and compressed into the container portion 12. The lid insert 14 is also sized to compress horizontally. This enables the lid insert 14 to make firm contact with the inner surface of the side wall, the bottom planar surface of the lid 13 and the uppermost layer of solder spheres to form an immobilizing seal.

The lid insert 14 is constructed of a non-reactive, compressible material including, but not limited to, closed-cell polymeric foams, such as polypropylene, polyethylene, neoprene, polyurethane, and polyfluorinated foams, such as polytetrafluoroethylene, as well as other suitable plastic or synthetic rubber foams. Although embodiments of the present invention may comprise a closed-cell foam, open-cell foams may equally serve as compressible lid inserts. Polymeric foams may be chemically treated or solids loaded to make them electrostatically dissipative to prevent solder spheres from being electrostatically attracted and adhered to the lid insert 14.

Figure 4:
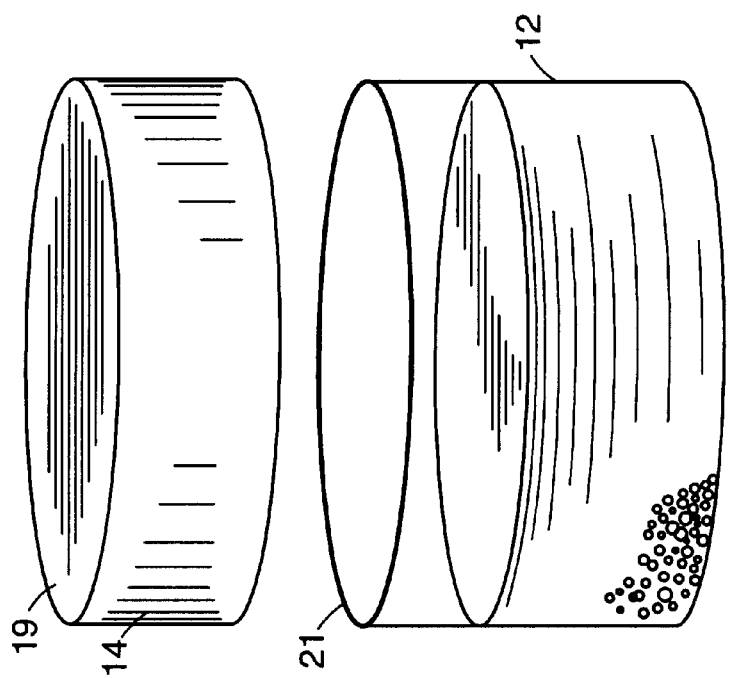
FIG. 4 illustrates a side view of the lid insert with a pressure plate attached thereon.

In another embodiment of the invention shown in FIG. 4, the lid insert 14 comprises a rigid or semi-rigid pressure plate 19, which is adhered to a top surface of the lid insert 14 to provide rigidity to the lid insert without compromising compressibility. A perimeter edge of the pressure plate 19 compresses against an internal diameter of the perimeter lip 21 of the open top terminal end 15 when the lid insert 14 is inserted into the container portion 12. As described above with respect to the lid insert 14, the perimeter edge of the pressure plate 19 compresses substantially adjacent to the inner surface of the side wall 20 of the container portion when the lid insert is positioned in the containing device, thereby creating a seal between the lid insert and the side wall of the container.

The pressure plate 19 is constructed of a thin layer or sheet of flexible, electrostatically dissipative, non-reactive plastic or polymer, such as, but not limited to, polypropylene, polyethylene, polyurethane, vinyl, PVC, or polyfluorinated polymers, such as polytetrafluoroethylene. The rigidity imparted to the lid insert by the pressure plate 19 provides even distribution of the compressive load applied to the solder spheres by the lid insert 14 when the lid insert is positioned within the containing device, thereby limiting movement of the solder spheres during storage and transport.

Figure 5:
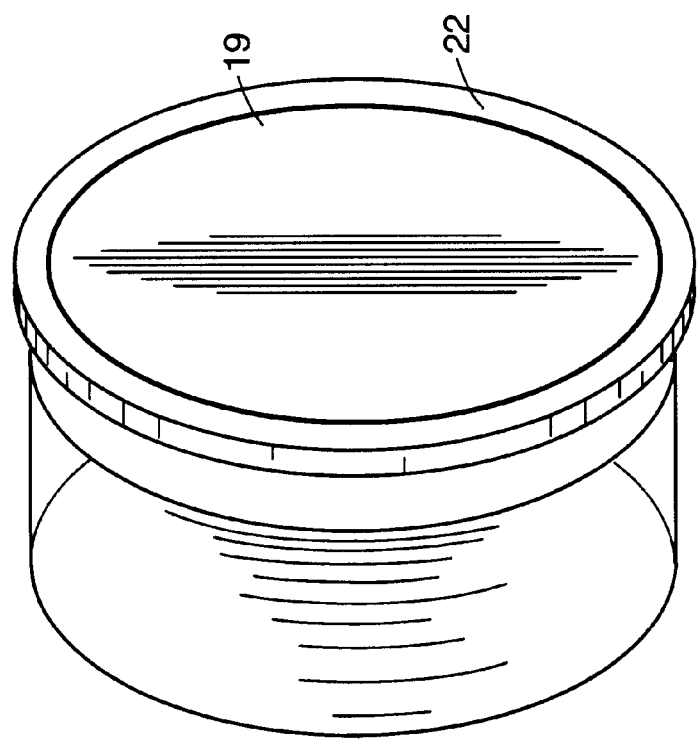
FIG. 5 illustrates a perspective of the lid insert with the pressure plate further comprising a circumferential rim.
Figure 6A:
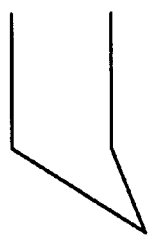
FIGS. 6A–6D illustrates cross-sectional views of four different constructions of a peripheral edge of the circumferential rim of the pressure plate.
Figure 6B:
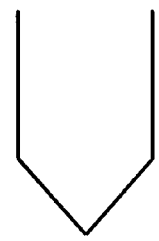
Figure 6C:
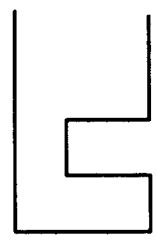
Figure 6D:
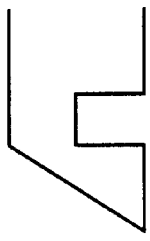

In another embodiment of the invention shown in FIG. 5, the lid insert pressure plate 19 comprises a peripheral or circumferential rim 22 constructed of a flexible, compliant material which compresses against the inner surface of the side wall 20 of the container portion 12 as the lid insert 14 is inserted and compressed into the containing device 11. The circumferential rim may be constructed of a non-reactive, compressible material including, but not exclusively limited to, closed cell polymeric foams, such as polypropylene, polyethylene, neoprene, polyurethane, and polyfluorinated foams, such as polytetrafluoroethylene, as well as other suitable plastic or synthetic rubber foams, such as vinyl, which may or may not be treated for electrostatic dissipative properties.

The flexible nature of the circumferential rim 22 enables the rim to act as a "wiper" to wipe the inner surface of the side wall as the lid insert is compressed into the container portion and to facilitate creation of a seal between the side wall and the lid insert.

FIGS. 6A–6D illustrate different embodiments of the circumferential rim 22 of the lid insert pressure plate 14. FIGS. 6A–6D show cross-sectional views of different structures of an outer perimeter of the circumferential rim 22 that compresses against and wipes the inner surface of the side wall as the lid insert is compressed into the container portion.

Figure 7:
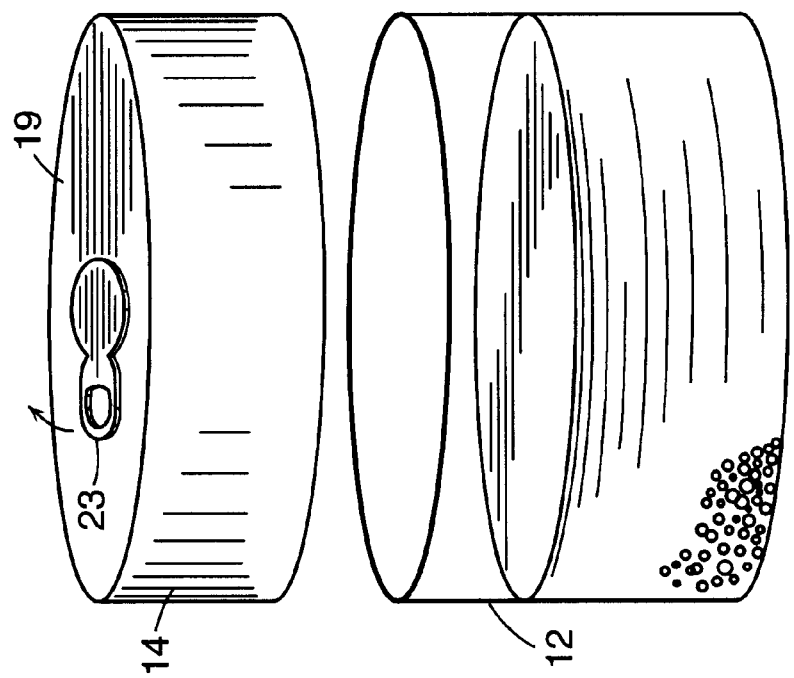
FIG. 7 illustrates a side view of the lid insert with a pull-type tab attached thereon.

In yet another embodiment of the invention as shown in FIG. 7, the lid insert 14 comprises a pull-type tab 23 which may be attached to a top surface of the pressure plate 19. The pull-type tab 23 facilitates removal of the lid insert from the container portion when the containing device is opened and removal of solder spheres is desired.

Figure 8:
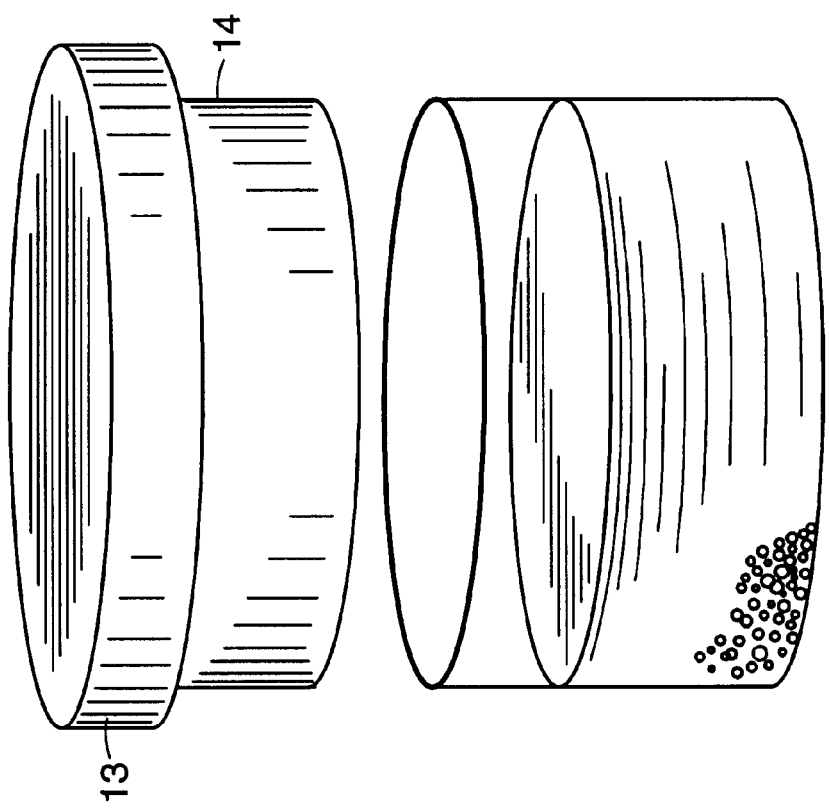
FIG. 8 illustrate a cross-sectional view of the lid insert attached to a bottom planar surface of the lid.

In still another embodiment of the invention as shown in FIG. 8, the lid insert 14 is adhered to the bottom planar surface of the lid 17, wherein the lid insert is inserted into and removed from the container portion when the lid is attached or detached from the container portion 12.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A containing device to hold and immobilize solder spheres comprising:

a hollow container portion having an open top terminal end and an opposing closed bottom terminal end with at least one side wall connecting the top and bottom terminal ends thereof;

a lid removably attachable to the open top terminal end to seal the container portion;

an insert removably insertable into the container portion and being of a dimension such that, upon insertion into the container portion, the insert is substantially adjacent to an inner surface of the side wall of the container portion and a bottom planar surface of the lid; and an electrostatically-dissipative pressure plate adhered to a top surface of the insert.

2. The containing device of claim 1, wherein the pressure plate is constructed of a polymer.

3. The containing device of claim 1, wherein the pressure plate is constructed of a plastic.

4. The containing device of claim 1, wherein the pressure plate further comprises a rim disposed along a circumferential perimeter of the pressure plate.

5. The containing device of claim 1, further comprising a mechanism adhered to a top surface of the pressure plate for removal of the insert from the container portion.

6. The containing device of claim 5, wherein the mechanism for removal of the insert includes a pull-type tab adhered to the top surface of the pressure plate.

7. A method of immobilizing solder spheres in storage and during transport comprising steps of:

holding solder spheres within a hollow container portion having an open top terminal end and an opposing closed bottom terminal end with at least one side wall connecting each terminal end and a lid removably attachable to the top terminal end;

inserting a compressible insert into the container portion;

applying pressure to the insert to compress the insert substantially adjacent to an inner surface of the side wall of the container portion, as well as a bottom planar surface of the lid and an uppermost layer of solder spheres contained therein; and attaching the lid to the container portion to seal the container portion.

8. A containing device to hold and immobilize solder spheres comprising:

a hollow container portion having an open top terminal end and an opposing closed bottom terminal end with at least one side wall connecting the top and bottom terminal ends thereof;

solder contained within the container portion;

a lid removably attachable to the open top terminal end to seal the container portion;

an insert removably insertable into the container portion and being of a dimension such that, upon insertion into the container portion, the insert is substantially adjacent to an inner surface of the side wall of the container portion and a bottom planar surface of the lid; and a pressure plate adhered to a top surface of the insert, the pressure plate comprising a compressible rim disposed along a circumferential perimeter of the pressure plate.

* * * * *